United States Patent
Fayrushin et al.

(10) Patent No.: US 9,082,750 B2
(45) Date of Patent: Jul. 14, 2015

(54) NON-VOLATILE MEMORY DEVICES HAVING REDUCED SUSCEPTIBILITY TO LEAKAGE OF STORED CHARGES

(71) Applicant: Samsung Electronics Co., Ltd., Suwon-si (KR)

(72) Inventors: Albert Fayrushin, Suwon-si (KR); Kwang Soo Seol, Yongin-si (KR); Jaeduk Lee, Seongnam-si (KR)

(73) Assignee: Samsung Electronics Co, Ltd. (KR)

( * ) Notice: Subject to any disclaimer, the term of this patent is extended or adjusted under 35 U.S.C. 154(b) by 0 days.

(21) Appl. No.: 14/218,293

(22) Filed: Mar. 18, 2014

(65) Prior Publication Data

US 2014/0197471 A1 Jul. 17, 2014

Related U.S. Application Data

(62) Division of application No. 12/894,863, filed on Sep. 30, 2010, now abandoned.

(30) Foreign Application Priority Data

Sep. 30, 2009 (KR) .................. 10-2009-0093315

(51) Int. Cl.
*H01L 29/788* (2006.01)
*H01L 29/76* (2006.01)
*H01L 29/423* (2006.01)
(Continued)

(52) U.S. Cl.
CPC ...... *H01L 29/4234* (2013.01); *H01L 27/11521* (2013.01); *H01L 29/42336* (2013.01); *H01L 29/66825* (2013.01); *H01L 29/7881* (2013.01); *H01L 29/7883* (2013.01);
(Continued)

(58) Field of Classification Search
CPC .......... H01L 27/11521; H01L 29/42336; H01L 29/42324; H01L 29/42328; H01L 29/66825; H01L 29/4234; H01L 29/7883; H01L 27/11517; H01L 29/42332; H01L 29/788; H01L 29/42368
USPC ............. 257/315, 321, 322, 316, E29.3
See application file for complete search history.

(56) References Cited

U.S. PATENT DOCUMENTS 6,088,269 A * 7/2000 Lambertson ............ 365/185.28
6,228,717 B1 5/2001 Hazama et al.
(Continued)

FOREIGN PATENT DOCUMENTS

JP 07-135267 5/1995
JP 08-162546 6/1996
(Continued)

*Primary Examiner* — Shouxiang Hu
(74) *Attorney, Agent, or Firm* — Myers Bigel Sibley & Sajovec, P.A.

(57) ABSTRACT

Provided is a semiconductor device. The semiconductor device includes a substrate, a tunnel insulating layer, a charge storage pattern, a blocking layer, a gate electrode. The tunnel insulating layer is disposed over the substrate. The charge storage pattern is disposed over the tunnel insulating layer. The charge storage pattern has an upper surface, a sidewall, and an edge portion between the upper surface and the sidewall. The blocking layer includes an insulating pattern covering the edge portion of the charge storage pattern, and a gate dielectric layer covering the upper surface, the sidewall, and the edge portion of the charge storage pattern. The gate electrode is disposed over the blocking layer, the gate electrode covering the upper surface, the sidewall, and the edge portion of the charge storage pattern.

20 Claims, 11 Drawing Sheets

(51) Int. Cl.
  *H01L 27/115* (2006.01)
  *H01L 29/66* (2006.01)
  *H01L 29/792* (2006.01)

(52) U.S. Cl.
  CPC ........ *H01L 29/792* (2013.01); *H01L 27/11568* (2013.01); *H01L 29/66833* (2013.01)

(56) References Cited

U.S. PATENT DOCUMENTS

| | | | |
|---|---|---|---|
| 6,894,339 B2 * | 5/2005 | Fan et al. | ................ 257/314 |
| 7,282,758 B2 | 10/2007 | Yoon | |
| 7,482,660 B2 | 1/2009 | Osari | |
| 2004/0023458 A1 | 2/2004 | Hsu et al. | |
| 2006/0186459 A1 * | 8/2006 | Chang et al. | ................ 257/315 |
| 2008/0003742 A1 | 1/2008 | Cho et al. | |
| 2008/0277716 A1 | 11/2008 | Nishida et al. | |
| 2009/0001448 A1 | 1/2009 | Sekine et al. | |
| 2010/0009503 A1 | 1/2010 | Kai et al. | |

FOREIGN PATENT DOCUMENTS

| | | |
|---|---|---|
| KR | 20060075363 | 7/2006 |
| KR | 100739993 B1 | 7/2007 |
| KR | 10-2008-0099157 | 11/2008 |
| KR | 10-2008-0099158 | 11/2008 |

* cited by examiner

NON-VOLATILE MEMORY DEVICES HAVING REDUCED SUSCEPTIBILITY TO LEAKAGE OF STORED CHARGES

CROSS-REFERENCE TO RELATED APPLICATIONS

This application is a divisional of U.S. patent application Ser. No. 12/894,863, filed Sep. 30, 2010, which claims priority to Korean Patent Application No. 10-2009-0093315, filed Sep. 30, 2009, the disclosures of all of which are hereby incorporated by reference in their entireties.

FIELD OF THE INVENTION

The present invention relates to semiconductor devices and, more particularly, to nonvolatile memory devices.

BACKGROUND

As various electronic devices are used in most products such as automobiles and ships that are manufactured in various industrial fields, the status of semiconductor industry is increasingly raised in modern industrial structure. As semiconductor devices are used in various industrial fields and become an important factor affecting the quality of electronic devices, automobiles and ships, demands on semiconductor device having excellent characteristics are being increased. In order to meet such demands, semiconductor technologies are being developed to implement high-integration, low power consumption, and/or high speed of the semiconductor devices.

Since data storage capacity and data recording and deleting characteristics of nonvolatile memory devices among semiconductor devices determine the reliability of various apparatuses equipped with the nonvolatile memory devices, their importance is being increasingly recognized.

SUMMARY

Methods of forming nonvolatile memory cells according to embodiments of the invention include forming a floating gate electrode having an upper surface and opposing sidewalls, on a substrate, and then forming a mask pattern on lower portions of the opposing sidewalls of the floating gate electrode. A capping layer is formed on the upper surface and on upper portions of the opposing sidewalls of the floating gate electrode, using the mask pattern to block direct contact between the capping layer and the lower portions of the opposing sidewalls of the floating gate electrode. The mask pattern is then removed to expose the lower portions of the opposing sidewalls of the floating gate electrode. The capping layer and the lower portions of the opposing sidewalls of the floating gate electrode are then covered with a dielectric layer. A word line is formed on a portion of the dielectric layer extending opposite the floating gate electrode.

According to additional embodiments of the invention, the step of forming a capping layer may include thermally oxidizing the upper surface and the upper portions of the opposing sidewalls of the floating gate electrode, using the mask pattern as an oxidation mask. In addition, the covering step may include forming the dielectric layer directly on the lower portions of the opposing sidewalls of the floating gate electrode.

According to still further embodiments of the invention, the step of forming a mask pattern may include depositing a silicon nitride layer on the upper surface and the opposing sidewalls of the floating gate electrode. The silicon nitride layer is then anisotropically etched to define the mask pattern on the lower portions of the opposing sidewalls of the floating gate electrode.

Methods of forming nonvolatile memory cells according to additional embodiments of the invention may include forming a floating gate electrode having an upper surface and opposing sidewalls, on a substrate. A dielectric layer is then deposited directly on the upper surface and the opposing sidewalls of the floating gate electrode. A lower word line is formed on a first portion of the dielectric layer extending opposite the sidewalls of the floating gate electrode. An electrically insulating spacer layer is formed on the lower word line and on a second portion of the dielectric layer extending opposite the upper surface of the floating gate electrode. The electrically insulating spacer layer is selectively etched back to expose the lower word line and the second portion of the dielectric layer and define electrically insulating spacers on third portions of the dielectric layer extending opposite upper sidewalls of the floating gate electrode. An upper word line may be formed directly on the exposed lower word line, the electrically insulating spacers and the exposed second portion of the dielectric layer.

In some embodiments of the invention, a trench isolation region may be formed adjacent the floating gate electrode. The step of depositing the dielectric layer may also include depositing the dielectric layer directly on the trench isolation region and the step of forming a lower word line may include forming the lower word line directly on a portion of the dielectric layer extending opposite the trench isolation region.

According to additional embodiments of the invention, the step of forming a floating gate electrode may be preceded by a step of forming a tunnel insulating layer on the substrate. The step of forming a floating gate electrode may also include depositing a polysilicon layer on the tunnel insulating layer and then selectively etching the polysilicon layer, the tunnel insulating and the substrate in sequence to define a floating gate electrode on the substrate and a trench in the substrate. The step of forming a trench isolation region may also include filling the trench with an electrically insulating material that contacts the sidewalls of the floating gate electrode. Embodiments of the invention may also include forming a tunnel insulating layer on the substrate in advance of forming a floating gate electrode.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
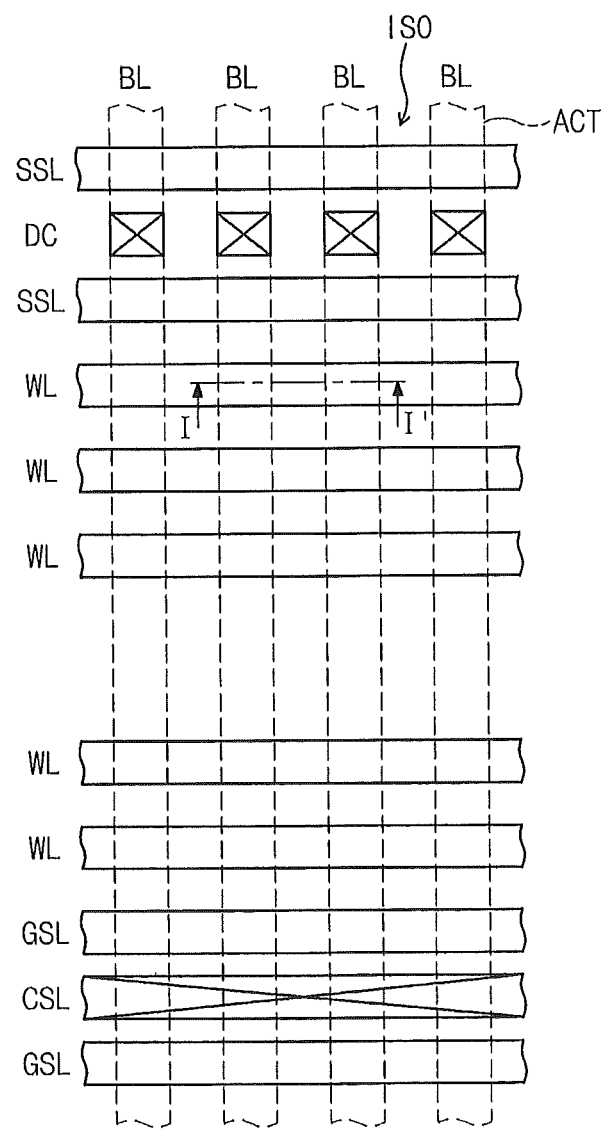
FIG. 1 is a plan view illustrating a semiconductor device according to embodiments of the invention.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, exemplary embodiments of the inventive concept will be described in detail with reference to the accompanying drawings.

Figure 2A:
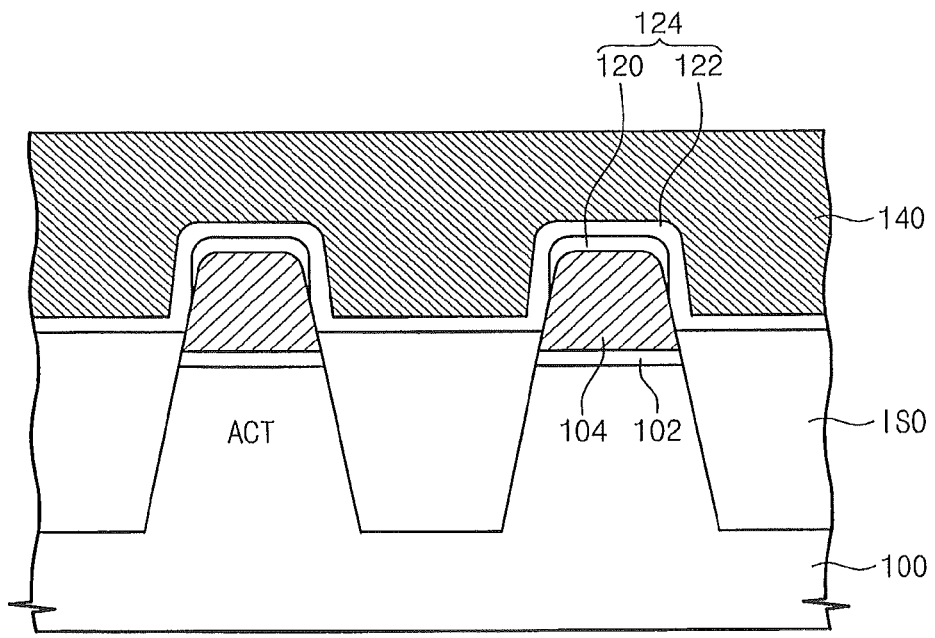
FIG. 2A is a cross-sectional view illustrating a semiconductor device according to an embodiment of the invention.

FIG. 1 is a plan view illustrating a semiconductor device according to an embodiment. FIG. 2A is a cross-sectional view taken along line I-I' of FIG. 1.

Referring to FIGS. 1 and 2A, a semiconductor substrate 100 having a cell region may have an active region ACT defined by a device isolation layer ISO. The active region ACT may be extended in a first direction. The active region ACT may include a channel region. When a nonvolatile memory device is operated, a channel may be generated in the channel region. A plurality of word lines WL may be extended in a second direction crossing the first direction. The word lines WL may be extended between a string select line SSL and a ground select line GSL parallel to the word lines WL. A common source line CSL may be parallelly disposed at one side of the ground select line GSL. Bit lines BL may be extended in a direction crossing the word lines WL. The bit lines BL may be connected to an active region ACT adjacent to the string select line SSL through a contact DC.

The substrate 100 may include a semiconductor of a single crystal structure. The substrate 100 may include a region that is electrically separated by impurity regions of different conductive types.

A tunnel insulating layer 102 may be disposed on the active region ACT. The tunnel insulating layer 102 may be a single layer or a multi-layer. For example, the tunnel dielectric layer 102 may include at least one of silicon oxynitride, silicon nitride, silicon oxide, and metal oxide.

A charge storage pattern 104 may be disposed on the tunnel insulating layer 102. The charge storage pattern 104 may have an upper surface and a sidewall. The length of the sidewall of the charge storage pattern 104 may be greater than the length of the upper surface of the charge storage pattern 104. The length of the bottom surface of the charge storage pattern 104 may be greater than the length of the upper surface of the charge storage pattern 104. The charge storage pattern 104 may include an edge portion between the upper surface of the charge storage pattern 104 and the sidewall of the charge storage pattern 104. The edge portion may include a portion of the upper surface of the charge storage pattern 104 adjacent to an edge at which the upper surface of the charge storage pattern 104 meet the sidewall of the charge storage pattern 104. The edge portion may include an upper portion of the sidewall of the charge storage pattern 104 adjacent to the edge. The edge portion of the charge storage pattern 104 may be a curved surface. The upper surface of the device isolation layer ISO may be higher than the bottom surface of the charge storage patter 104.

The charge storage pattern 104 may include a doped poly silicon or undoped poly silicon. The charge storage pattern 104 may include charge trap sites that can store charges. For example, the charge storage pattern 104 may include at least one of a silicon nitride layer, a metal nitride layer, a metal oxynitride layer, a metal silicon oxide, a metal silicon oxynitride layer, and nano dots.

A blocking layer 124 may be disposed on the charge storage pattern 104. The blocking layer 124 may cover the upper surface and the sidewall of the charge storage pattern 104. The blocking layer 124 may cover the upper surface of the device isolation layer ISO. The thickness of a portion of the blocking layer 124 covering the edge portion and the upper surface of the charge storage pattern 104 may be greater than the thickness of the other portion of the blocking layer 124.

The blocking layer 124 may include an insulating pattern covering the upper portion of the sidewall of the charge storage pattern 104 and the upper surface of the charge storage pattern 104. The insulating pattern may cover the edge portion of the charge storage pattern 104. The insulating pattern may be a capping layer 120. The thickness of a portion of the capping layer 120 covering the sidewall of the charge storage pattern 104 may be smaller than the thickness of the capping layer 120 covering the edge portion of the charge storage pattern 104. The capping layer 120 may be an oxidized product of the charge storage pattern 104. The capping layer 120 may include the same element as the charge storage pattern 104. For example, when the charge storage pattern 104 includes polysilicon, the capping layer 120 may include silicon oxide. In this case, the silicon of the silicon oxide included in the capping layer 120 may include silicon has been included in the charge storage pattern 104.

The blocking layer 124 may include a gate dielectric layer 122 disposed on the capping layer 120. The gate dielectric layer 122 may cover the capping layer 120. The blocking layer 124 may cover the upper surface and the sidewall of the charge storage pattern 104. The blocking layer 128 may cover the upper surface of the device isolation layer ISO. The gate dielectric layer 122 may be provided through a different process from the capping layer 120. A discontinuous surface may be provided between the capping layer 120 and the gate dielectric layer 122. The capping layer 120 and the gate dielectric layer 122 may be differentiated from each other by the discontinuous surface.

The gate dielectric layer 122 may include the same material as the capping layer 120. For example, the gate dielectric layer 122 and the capping layer 120 may include a silicon oxide. When the capping layer 120 is an oxidized product of the charge storage pattern 104, and the gate dielectric layer 122 is deposited, the respective concentrations of materials forming the capping layer 120 and the gate dielectric layer 122 may be different from each other. For example, the concentration of the material forming the capping layer 120 may be greater than the concentration of the material forming the gate dielectric layer 122.

The gate dielectric layer 122 may be a multi-layer. The gate dielectric layer 122 may include a material having a dielectric constant greater than that of the tunnel insulating layer 102. The gate dielectric layer 122 may include at least one of silicon oxide, silicon nitride, silicon oxynitride, and high dielectric layer. The high dielectric layer may include at least one of metal oxide, metal nitride, and metal oxynitride. The high dielectric layer may include Hafnium (Hf), Zirconium (Zr), Aluminum (Al), Tantalum (Ta), Lanthanum (La), Cerium (Ce), and Praseodymium (Pr).

A gate electrode 140 may be disposed on the blocking layer 124. The gate electrode 140 may cover the upper surface, the sidewall, and the edge portion of the charge storage pattern 104. The gate electrode 140 may be the word line WL. The gate electrode 140 may be a single layer or a multi-layer. The gate electrode 140 may include at least one of doped polysilicon, metal, metal silicide, and metal nitride. For example, the metal silicide may include a tungsten silicide, titanium silicide, cobalt silicide, and tantalum silicide. The metal nitride may include a nitride titanium and nitride tantalum.

A source region (not shown) and a drain region (not shown) may be formed in the substrate 100 at both sides of the gate electrode 140. The source region and the drain region may be a region doped with dopants. In contrast, the source region and the drain region may include an inversion layer generated by an operating voltage applied to the gate electrode 140. The inversion layer may be generated by a fringe field generated in the gate electrode 140 by the operating voltage.

In delete and program operations of the semiconductor device according to an embodiment, a voltage may be provided between the gate electrode 140 and the channel region. An electric field may be applied between the gate electrode 140 and the charge storage pattern 104. The electric field between the gate electrode 140 and the charge storage pattern 104 may be concentrated on the edge portion between the upper surface of the charge storage pattern 104 and the sidewall of the charge storage pattern 104. When the electric field is concentrated on the edge portion of the charge storage pattern 104, electric charges of the charge storage pattern 104 may be lost by the electric field concentrated on the edge portion, thereby resulting in degradation of the reliability of the semiconductor device. For example, the semiconductor device may be an NMOS device, in which program may be operated. In this case, electrons may be stored in the charge storage pattern 104, and the electric field may be applied in a direction from the gate electrode 140 to the charge storage pattern 104. When the electric field is concentrated on the edge portion of the charge storage pattern 104, electrons stored in the charge storage pattern 104 may be moved to the gate electrode 140 through the blocking layer 124 by the concentrated electric field.

According to an embodiment, however, the edge of the charge storage pattern 104 may have a curved surface to reduce the concentration of the electric field on the edge portion. Also, due to the capping layer 120, the thickness of a portion of the blocking layer 124 covering the edge portion between the upper surface and the sidewall of the charge storage pattern 104 may be greater than the thickness of the other portion of the blocking layer 124. Since the electric field is inhibited from being concentrated on the edge portion, a semiconductor device having high reliability can be provided.

Figure 2B:
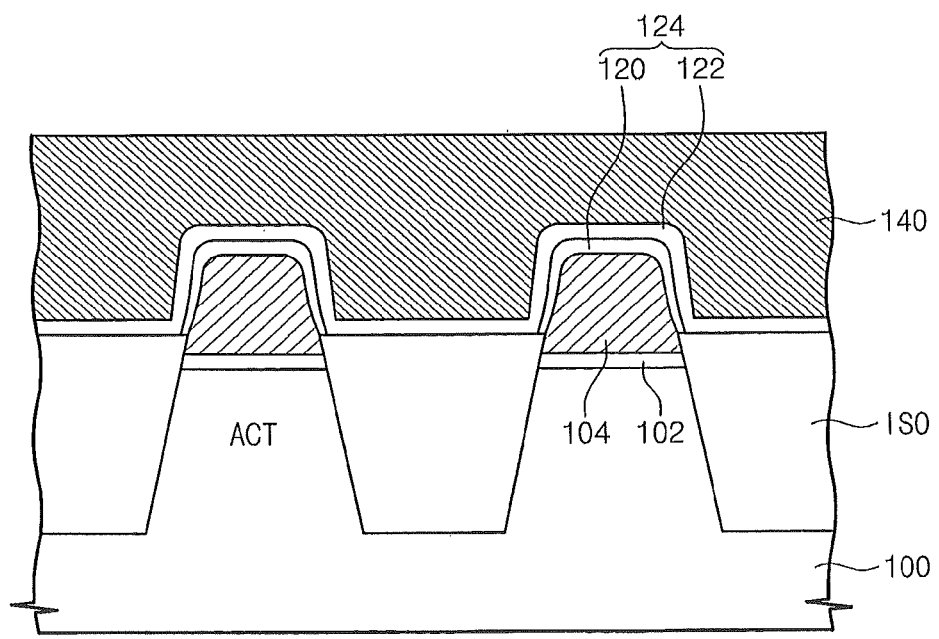
FIG. 2B is a cross-sectional view illustrating a semiconductor device according to a modification of an embodiment of the invention.

Hereinafter, a semiconductor device according to a modification of an embodiment will be described. FIG. 2B is a cross-sectional view taken along line I-I' of FIG. 1 illustrating a semiconductor device according to a modification of an embodiment.

Referring to FIGS. 1 and 2B, a semiconductor device according to a modification of an embodiment may be similar to a semiconductor device described in FIG. 2A. However, the capping layer 120 may be extended along the sidewall of the charge storage pattern 104 from the edge portion of the charge storage pattern 104 to the bottom surface of the charge storage pattern 104. The capping layer 120 may be connected to the device isolation layer ISO.

Hereinafter, a method for forming a semiconductor device according to an embodiment will be described. FIGS. 3A through 3D are cross-sectional views illustrating a method for forming a semiconductor device according to an embodiment.

Figure 3A:
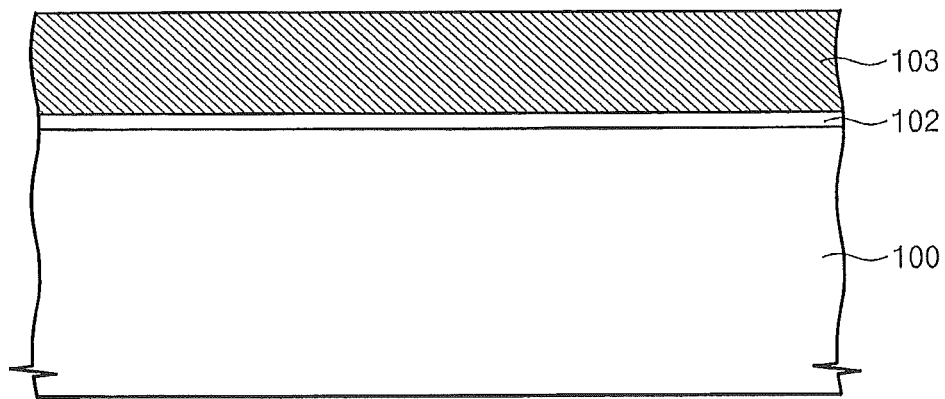
FIGS. 3A through 3D are cross-sectional views illustrating a method for forming a semiconductor device according to an embodiment of the invention.

Referring to FIG. 3A, a substrate 100 may be provided. The substrate 100 may include a semiconductor of a single crystal structure. A tunnel insulating layer 102 may be formed on the substrate 100. The tunnel dielectric layer 102 may include at least one of silicon oxide, silicon nitride, silicon oxynitride, and metal oxide. The tunnel insulating layer 102 may be formed by at least one of Chemical Vapor Deposition (CVD), Physical Vapor Deposition (PVD), and Atomic Layer Chemical Vapor Deposition (ALCVD). A charge storage layer 103 may be disposed on the tunnel insulating layer 102. The charge storage layer 103 may include doped poly silicon or undoped poly silicon. For example, the charge storage layer 103 may include at least one of silicon nitride layer, metal nitride, metal oxynitride, metal silicon oxide, metal silicon oxynitride, and nano dots The charge storage layer 103 may be formed by at least one of Chemical Vapor Deposition (CVD), Physical Vapor Deposition (PVD), and Atomic Layer Chemical Vapor Deposition (ALCVD).

Unlike the drawing, the tunnel insulating layer 102 may be formed on the substrate 100, and then a mask layer (e.g., silicon nitride) may be formed on the tunnel insulating layer 102. Thereafter, the substrate 100, the tunnel insulating layer 102, and the mask layer (e.g., silicon nitride) may be etched to form a trench, and then a device isolation layer ISO may be formed to fill the trench. Thereafter, the mask layer (e.g., silicon nitride) may be removed, and then the charge storage layer 103 may be formed.

Figure 3B:
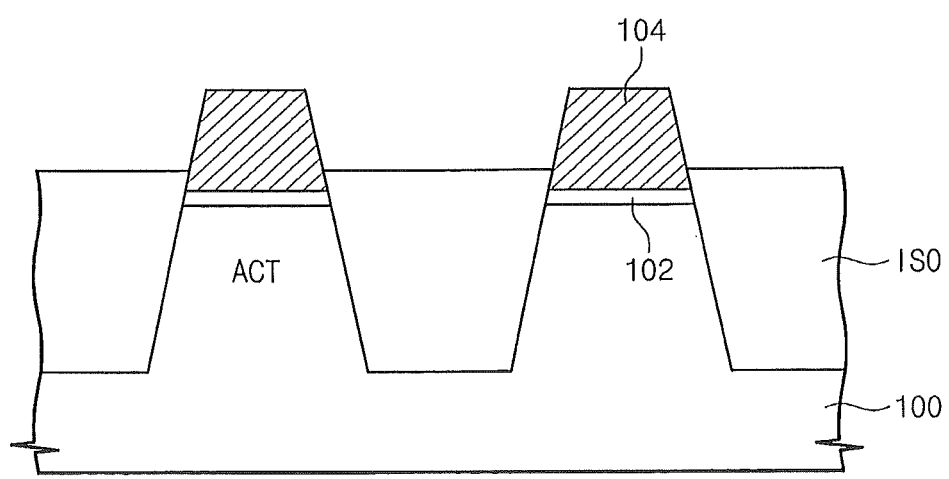

Referring to FIG. 3B, a mask pattern (e.g., photoresist pattern) may be formed on the charge storage layer 103. Portions of the substrate 100, the tunnel insulating layer 102, and the charge storage layer 103 may be etched using the mask pattern as an etch mask. A portion of the substrate 100 may be etched to form a trench. A device isolation layer ISO may be formed to fill the trench. The upper surface of the device isolation layer ISO may be higher than the bottom surface of the charge storage layer 103. The charge storage layer 103 may be etched to form the charge storage pattern 104. The charge storage pattern 104 may include an upper surface, a sidewall, and an edge portion between the upper surface and the sidewall. The edge portion may include a portion of the upper surface of the charge storage pattern 104 adjacent to an edge at which the upper surface of the charge storage pattern 104 meet the sidewall of the charge storage pattern 104. The edge portion may include an upper portion of the sidewall of the charge storage pattern 104 adjacent to the edge. The length of the sidewall of the charge storage pattern 104 may be greater than the length of the upper surface of the charge storage pattern 104.

Figure 3C:
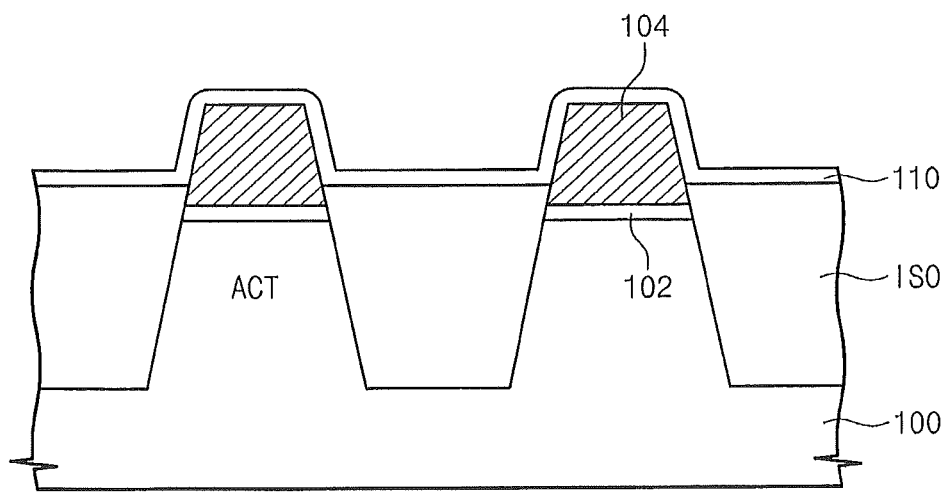

Referring to FIG. 3C, a mask layer 110 may be formed to cover the upper surface of the device isolation layer ISO and the upper surface and the sidewall of the charge storage pattern 104. The mask layer 110 may be uniformly formed on the device isolation layer ISO and the charge storage pattern 104. The mask layer 110 may have an etch selectivity with respect to the device isolation layer ISO and the charge storage pattern 104. For example, when the device isolation layer ISO includes silicon oxide, and the charge storage pattern 104 includes poly silicon, the mask layer 110 may include silicon nitride.

Figure 3D:
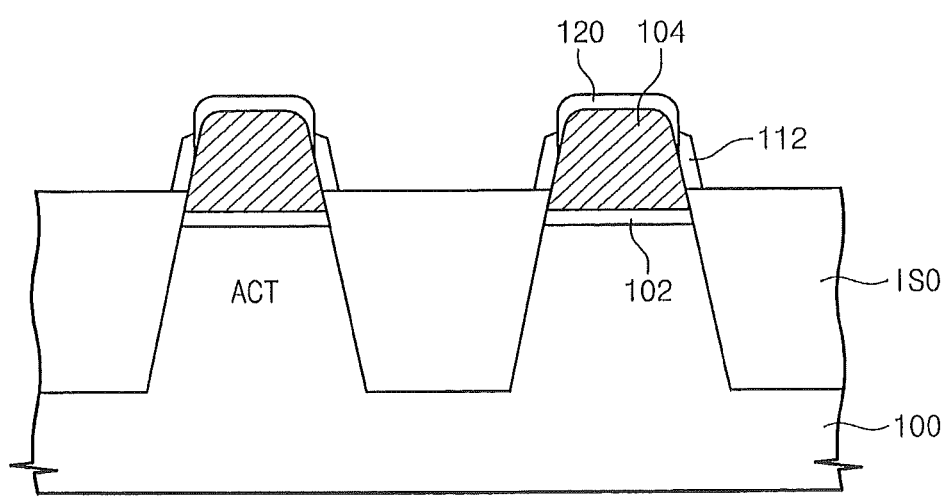

Referring to FIG. 3D, the mask layer 110 may be etched. The mask layer 110 may be etched using an anisotropic etching process. The mask layer 110 may be etched to form a mask pattern 112 exposing the upper surface and the edge portion of the charge storage pattern 104. The mask pattern 112 may expose the upper surface of the device isolation ISO.

After the mask pattern 112 is formed, a capping layer 120 may be formed. For example, the capping layer 120 may be formed by oxidizing the charge storage pattern 104 using a thermal oxidation. The capping layer 120 may cover the upper surface and the edge portion of the charge storage pattern 104 exposed by the mask pattern 112.

When the capping layer 120 is formed by oxidizing the charge storage pattern 104, the edge portion of the charge storage pattern 104 may be a curved surface. The capping layer 120 may include the same element as the charge storage pattern 104. For example, when the charge storage pattern 102 includes polysilicon, the capping layer 120 may include silicon oxide. In this case, silicon of the silicon oxide included in the capping layer 120 may be silicon that has been included in the charge storage pattern 102. The capping layer 120 may include a material having etch selectivity with respect to the mask pattern 112. For example, the capping layer 120 may include silicon oxide, and the mask pattern 112 may include silicon nitride.

Referring again to FIG. 2A, the mask pattern 112 may be removed. The mask pattern 112 may be removed by an isotropic etching process. A gate dielectric layer 122 may be formed to cover the charge storage pattern 104, the capping layer 120, and the device isolation layer ISO. The gate dielectric layer 122 may include at least one of silicon oxide, silicon nitride, silicon oxynitride, and high dielectric layer. Thus, a blocking layer 124 may be formed to include the gate dielectric layer 122 and the capping layer 120. The thickness of a portion of the blocking layer 124 covering the edge portion and the upper surface of the charge storage pattern 104 may be greater than the thickness of a portion of the blocking layer 124 covering the sidewall of the charge storage pattern 104.

A gate electrode 140 may be formed on the gate dielectric layer 122. The gate electrode 140 may cover the upper surface and the sidewall of the charge storage pattern 104. The gate electrode 140 may include at least one of doped polysilicon, metal, metal silicide, and metal nitride.

Hereinafter, a method for forming a semiconductor device according to a modification of an embodiment will be described.

Referring to FIG. 2B, in the method for forming a semiconductor device described with reference to FIGS. 3A through 3D, an additional thermal oxidation process may be performed before the gate dielectric layer 122 is formed after the mask pattern 112 is removed. The additional thermal oxidation process may be performed for a shorter time than the thermal oxidation process for forming the capping layer 120. The charge storage pattern 104 may be further oxidized by the additional thermal oxidation process. The capping layer 21 may be extended along the sidewall of the charge storage pattern 104 from the edge portion of the charge storage pattern 104 to the bottom surface of the charge storage pattern 104. A damage of the charge storage pattern 104 generated during the removal of the mask pattern may be cured by the additional thermal oxidation process.

Figure 4:
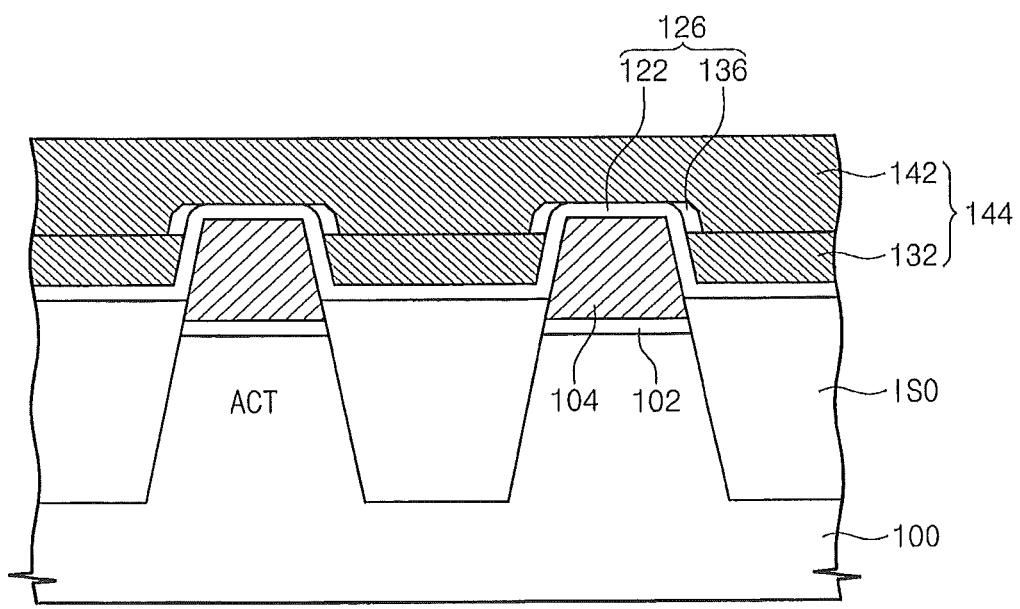
FIG. 4 is a cross-sectional view illustrating a semiconductor device according to another embodiment of the invention.

Hereinafter, a semiconductor device according to another embodiment will be described. FIG. 4 is a cross-sectional view taken along line I-I' of FIG. 1, illustrating a semiconductor device according to another embodiment.

Referring to FIGS. 1 and 4, a substrate 100, a tunnel insulating layer 102, and a charge storage pattern 104 as described in FIG. 2A may be provided. A blocking layer 126 may be disposed on the charge storage pattern 104. The blocking layer 126 may cover the upper surface and the sidewall of the charge storage pattern 104. The blocking layer 126 may cover the upper surface of the device isolation layer ISO. The thickness of a portion of the blocking layer 126 covering the edge portion between the upper surface and the sidewall of the charge storage pattern 104 may be greater than the thickness of the other portion of the blocking layer 126.

The blocking layer 126 may include a gate dielectric layer 122 covering the upper surface of the charge storage pattern 104 and the sidewall of the charge storage pattern 104. The gate dielectric layer 122 may be the gate dielectric layer described in FIG. 2A. The gate dielectric layer 122 may contact the charge storage pattern 104. The gate dielectric layer 122 may include the upper surface of the gate dielectric layer 122 covering the upper surface of the charge storage pattern 104, and the sidewall of the gate dielectric layer 122 covering the sidewall of the charge storage pattern 104.

The block layer 126 may include an insulating pattern disposed on the gate dielectric layer 122. The insulating pattern may be a spacer 136. The spacer 136 may be disposed on a portion of the gate dielectric layer 122 covering the edge portion of the charge storage pattern 104. The spacer 136 may be disposed on an upper portion of the sidewall of the gate dielectric layer 122. The upper surface of the spacer 136 may be higher than the upper surface of the charge storage pattern 104. The bottom surface of the spacer 136 may be higher than the bottom surface of the charge storage pattern 104. The bottom surface of the spacer 136 may be lower than the upper surface of the charge storage pattern 104. The spacer 136 may include a different material from the gate dielectric layer 122. For example, when the gate dielectric layer 122 includes silicon oxide, the spacer 136 may include silicon nitride.

A gate electrode 144 may be disposed on the blocking layer 126. The gate electrode 144 may cover the upper surface, the sidewall, and the edge portion of the charge storage pattern 104. The gate electrode 144 may include a lower gate electrode 132 and an upper gate electrode 142 disposed on the lower gate electrode 132. The lower gate electrode 132 may have the same materials as the upper gate electrode 142. In contrast, the lower gate electrode 132 may have the different materials from the upper gate electrode 142. An interface between the upper surface of the lower gate electrode 132 and the bottom surface of the upper gate electrode 142 may be a discontinuous surface. The lower gate electrode 132 and the upper gate electrode 142 may be divided by the discontinuous surface. The upper surface of the lower gate electrode 132 may have the same height as the bottom surface of the spacer 136. The upper surface of the lower gate electrode 132 may lie in the same plane as the bottom surface of the spacer 136. The upper surface of the lower gate electrode 132 may be coplanar with the bottom surface of the spacer 136.

The gate electrode 144 may be a word line WL. The lower and upper gate electrodes 132 and 142 may be a single layer or a multi-layer, respectively. The lower and upper gate electrodes 132 and 142 may include at least one selected from poly silicon, metal, metal silicide, and metal nitride, respectively. The metal silicide may include tungsten silicide, titanium silicide, cobalt silicide, and tantalum silicide. The metal nitride may include nitride titanium and nitride tantalum.

Hereinafter, a method for forming a semiconductor device according to another embodiment will be described. FIGS. 5A through 5D are cross-sectional views illustrating a method for forming a semiconductor device according to another embodiment.

Figure 5A:
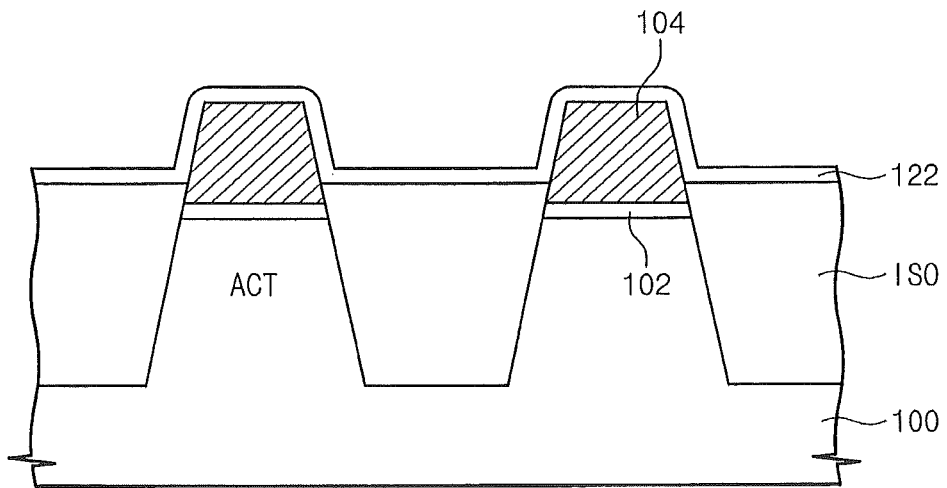
FIGS. 5A through 5D are cross-sectional views illustrating a method for forming a semiconductor device according to another embodiment of the invention.

Referring to FIG. 5A, a substrate 100, a tunnel insulating layer 102, and a charge storage pattern 104 as described in FIGS. 3A and 3B may be provided. A gate dielectric layer 122 may be formed to cover the upper surface and the sidewall of the charge storage pattern 104. The gate dielectric layer 122 may include the upper surface of the gate dielectric layer 122 covering the upper surface of the charge storage pattern 104, and the sidewall of the gate dielectric layer 122 covering the sidewall of the charge storage pattern 104. The gate dielectric layer 122 may include at least one of silicon oxide, silicon nitride, silicon oxynitride, and high dielectric layer.

Figure 5B:
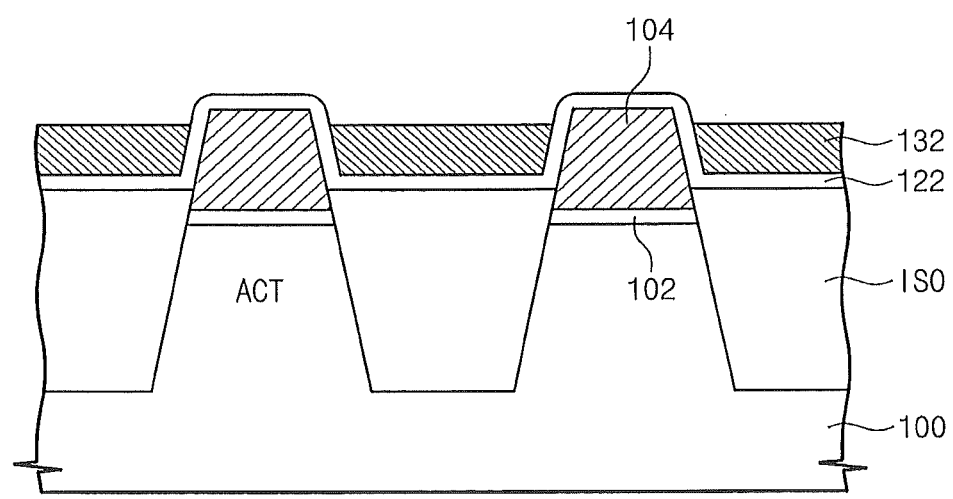

Referring to FIG. 5B, a material layer may be formed on the gate dielectric layer 122. The material layer may be a lower gate electrode 132. The upper surface of the lower gate electrode 132 may be lower than the upper surface of the charge storage pattern 104. For example, a gap between the upper surface of the lower gate electrode 132 and the upper surface of the charge storage pattern 104 may range from about 10 nm to about 20 nm. The lower gate electrode 132 may be formed to expose the gate dielectric layer 122 covering the edge portion and the upper surface of the charge storage pattern 104. The lower gate electrode 132 may expose the upper surface of the gate dielectric layer 122. The lower gate electrode 132 may expose an upper portion of the sidewall of the gate dielectric layer 122.

The forming of the lower gate electrode 132 may include forming a lower gate electrode layer and etching a portion of the lower gate electrode layer. The lower gate electrode 132 may include at least one of doped polysilicon, metal, metal silicide, and metal nitride. The lower gate electrode 132 may include a material having etch selectivity with respect to the gate dielectric layer 122. For example, when the gate dielectric layer 122 includes silicon oxide, the lower gate electrode 132 may include poly silicon.

Figure 5C:
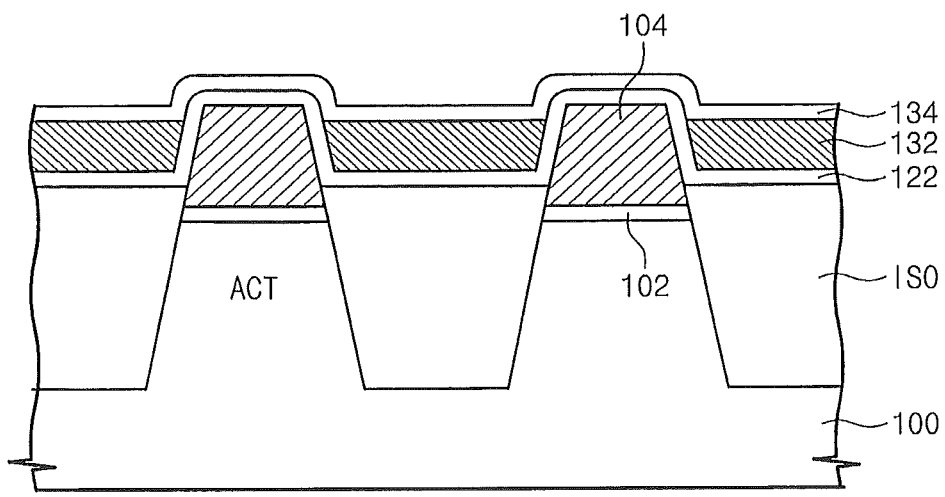

Referring to FIG. 5C, a spacer layer 134 may be formed to cover the upper surface of the lower gate electrode 132 and the gate dielectric layer 122 exposed by the lower gate electrode 132. The spacer layer 134 may include a material having etch selectivity with respect to the gate dielectric layer 122 and the lower gate electrode 132. For example, when the gate dielectric layer 122 includes silicon oxide, and the lower gate electrode 132 includes poly silicon, the spacer layer 134 may include silicon nitride.

Figure 5D:
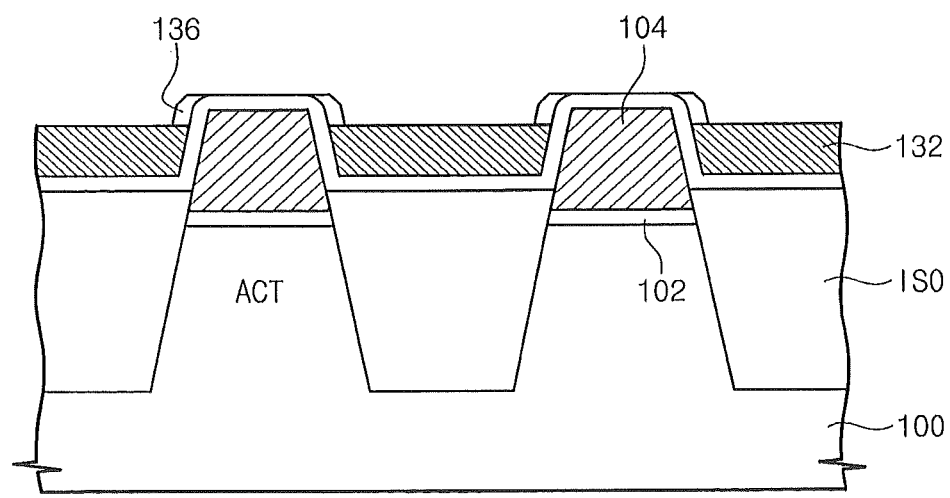

Referring to FIG. 5D, the spacer layer 134 may be etched to expose the upper surface of the gate dielectric layer 122 and the upper surface of the lower gate electrode 132 and to form a spacer 136 covering the upper portion of the sidewall of the gate dielectric layer 122. The spacer 136 may cover a portion of the gate dielectric layer 122 covering the edge portion of the charge storage layer 104. The spacer 136 may cover the upper portion of the sidewall of the gate dielectric layer 122. The forming of the spacer 136 may include etching the spacer layer 134 anisotropically. Thus, a blocking layer 126 may be formed to include the spacer layer 134 and the gate dielectric layer 122. The thickness of a portion of the blocking layer 126 covering the edge portion of the charge storage pattern 104 may be greater than the thickness of the blocking layer 126 covering the other portion of the charge storage pattern 104.

Referring to FIG. 4, the upper gate electrode 142 may be formed to cover the lower gate electrode 132 and the blocking layer 126. The upper gate electrode 142 may include the same materials as the lower gate electrode 132. An interface between the upper gate electrode 142 and the lower gate electrode 132 may be a discontinuous surface. The upper gate electrode 142 may include at least one of doped polysilicon, metal, metal silicide, and metal nitride.

Figure 6A:
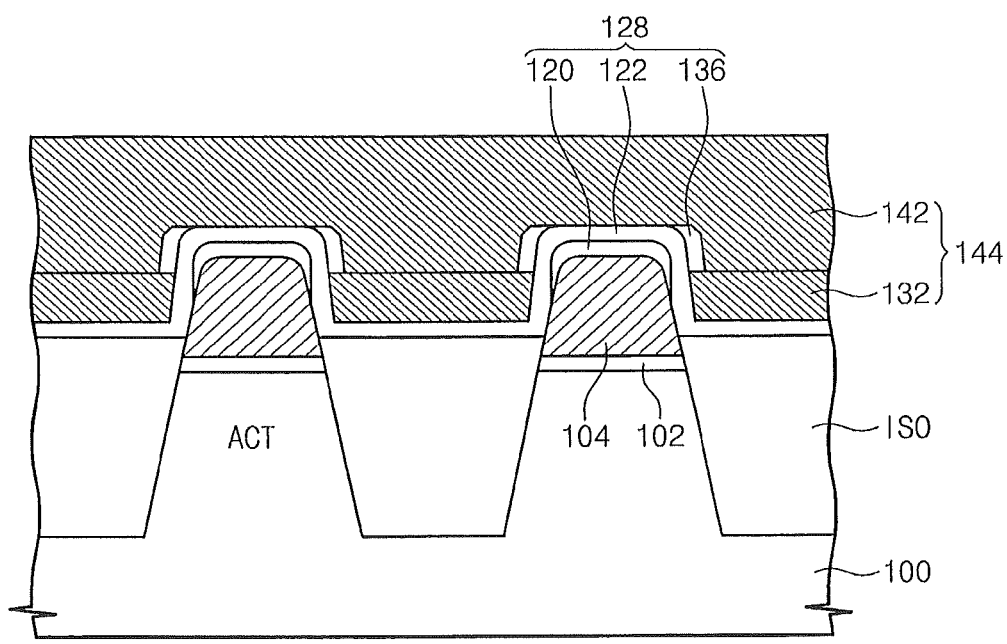
FIG. 6A is a cross-sectional view illustrating a semiconductor device according to still another embodiment of the invention.

Hereinafter, a semiconductor device according to still another embodiment will be described. FIG. 6A is a cross-sectional view taken along line I-I' of FIG. 1, illustrating a semiconductor device according to still another embodiment.

Referring to FIGS. 1 and 6A, a substrate 100, a tunnel insulating layer 102, and a charge storage pattern 104 as described in FIG. 2 may be provided. A blocking layer 128 may be disposed on the charge storage pattern 104. The blocking layer 128 may cover the upper surface and the sidewall of the charge storage pattern 104. The blocking layer 128 may cover the upper surface of the device isolation layer ISO. The edge portion may include a portion of the upper surface of the charge storage pattern 104 adjacent to an edge at which the upper surface of the charge storage pattern 104 meet the sidewall of the charge storage pattern 104. The edge portion may include an upper portion of the sidewall of the charge storage pattern 104 adjacent to the edge. The thickness of a portion of the blocking layer 128 covering the edge portion and the upper surface of the charge storage pattern 104 may be greater than the thickness of the other portion of the blocking layer 128.

The blocking layer 128 may include a capping layer 120 covering the edge portion and the upper surface of the charge storage pattern 104. The capping layer 120 may be the capping layer described in FIG. 2A. The blocking layer 128 may include a gate dielectric layer 122 disposed on the capping layer 120. The gate dielectric layer 122 may cover the upper surface and the sidewall of the charge storage pattern 104. The gate dielectric layer 122 may cover the capping layer 120. The gate dielectric layer 122 may be the gate dielectric layer described in FIG. 2A. The block layer 128 may include a spacer 136 disposed on the gate dielectric layer 122. The spacer 136 may cover a portion of the gate dielectric layer 122 covering the edge portion of the charge storage layer 104. The spacer 136 may be the spacer 136 described in FIG. 4.

The capping layer 120, the gate dielectric layer 122, and the spacer 136 may be provided through different processes. The capping layer 120 and the gate dielectric layer 122 may be divided by a discontinuous surface therebetween. The spacer 136 may include different materials from the capping layer 120 and the gate dielectric layer 122.

A gate electrode 144 may be disposed on the blocking layer 128. The gate electrode 144 may include a lower gate electrode 132 and an upper gate electrode 142 disposed on the lower gate electrode 132. The lower and upper gate electrodes 132 and 142 may be the gate electrodes described in FIG. 4.

Figure 6B:
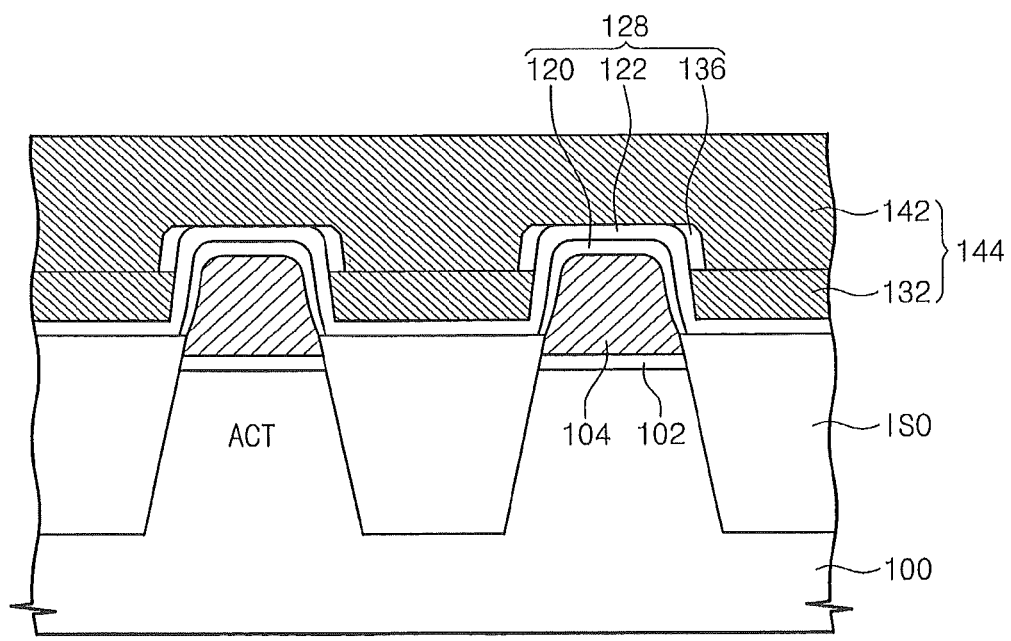
FIG. 6B is a cross-sectional view illustrating a semiconductor device according to a modification of still another embodiment of the invention.

Hereinafter, a semiconductor device according to a modification of still another embodiment will be described. FIG. 6B is a cross-sectional view taken along line I-I' of FIG. 1, illustrating a semiconductor device according to still another embodiment.

Referring to FIGS. 1 and 6B, a semiconductor device according to a modification of still another embodiment may be similar to a semiconductor device described in FIG. 6A. However, the capping layer 120 may be extended to the device isolation layer ISO along the sidewall of the charge storage pattern 104 from the edge portion of the charge storage pattern 104 to the bottom surface of the charge storage pattern 104.

Figure 7A:
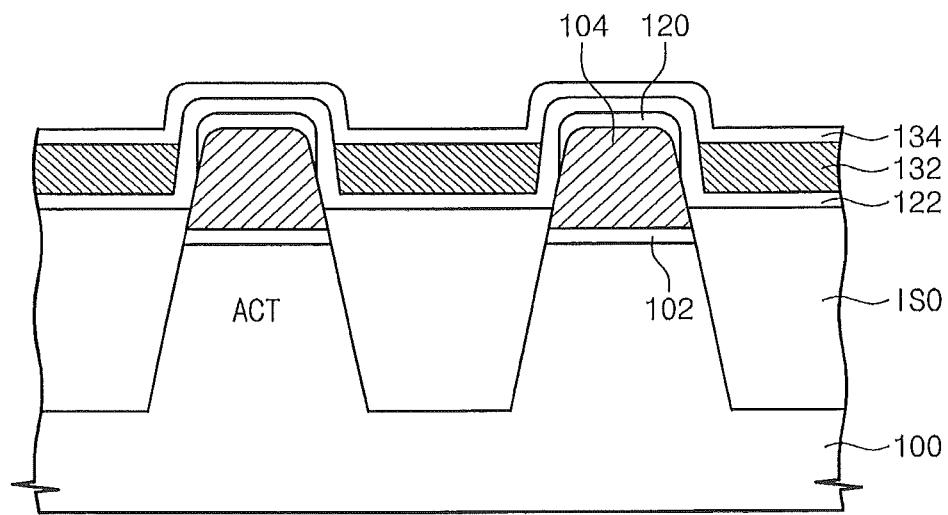
FIGS. 7A through 7B are cross-sectional views illustrating a method for forming a semiconductor device according to still another embodiment of the invention.
Figure 7B:
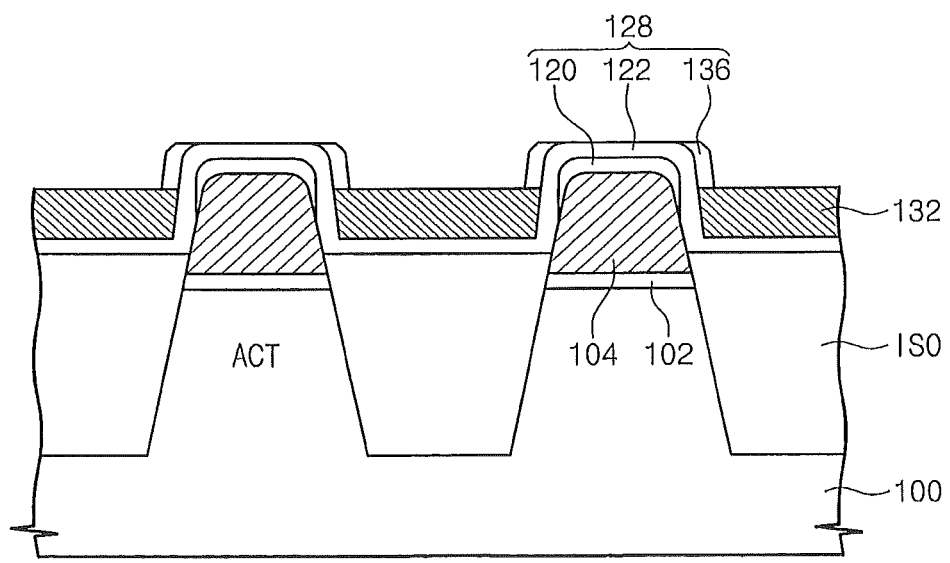

Hereinafter, a method for forming a semiconductor device according to still another embodiment will be described. FIGS. 7A through 7B are cross-sectional views illustrating a method for forming a semiconductor device according to still another embodiment.

Referring to FIG. 7A, a substrate 100, a tunnel insulating layer 102, and a charge storage pattern 104, a capping layer 120, and a gate dielectric layer 122 according to the method for forming a semiconductor device described in FIG. 2A and FIGS. 3A through 3D may be provided. A lower gate electrode 132 may be formed on the gate dielectric layer 122. The lower gate electrode 132 may be formed to expose a portion of the gate dielectric layer 122 covering the edge portion and the upper surface of the charge storage pattern 104. The gate dielectric layer 132 may be formed by the method described in FIG. 5B.

A spacer layer 134 may be formed on the lower gate electrode 132 and the exposed gate dielectric layer 122. The gate dielectric layer 134 may be formed by the method described in FIG. 5C.

Referring to FIG. 7B, a spacer 136 may be formed to expose the upper surface of the gate dielectric layer 122 and cover an upper portion of the sidewall of the gate dielectric layer 122. The spacer 136 may cover a portion of the gate dielectric layer 122 covering the edge portion of the charge storage layer 104. The spacer 136 may be formed by the method described in FIG. 5D. A blocking layer 124 may be formed to include the capping layer 120, the gate dielectric layer 122, and the spacer 136. The thickness of a portion of the blocking layer 128 covering the edge portion and the upper surface of the charge storage pattern 104 may be greater than the thickness of the other portion of the blocking layer 128.

Referring again to FIG. 6A, an upper gate electrode 142 may be formed on the blocking layer 128 and the lower gate electrode 132. The upper gate electrodes 142 may be the upper gate electrode described in FIG. 4.

Hereinafter, a method for forming a semiconductor device according to a modification of still another embodiment will be described.

Referring to FIG. 6B, in the method for forming a semiconductor device described with reference to FIGS. 7A through 7D, an additional thermal oxidation process may be performed before the gate dielectric layer 122 is formed. The additional thermal oxidation process may be performed for a shorter time than the thermal oxidation process for forming the capping layer 120. The charge storage pattern 104 may be further oxidized by the additional thermal oxidation process. The capping layer 121 may be extended along the sidewall of the charge storage pattern 104 from the edge portion of the charge storage pattern 104 to the bottom surface of the charge storage pattern 104.

Hereinafter, applications according to the embodiment will be described.

Figure 8:
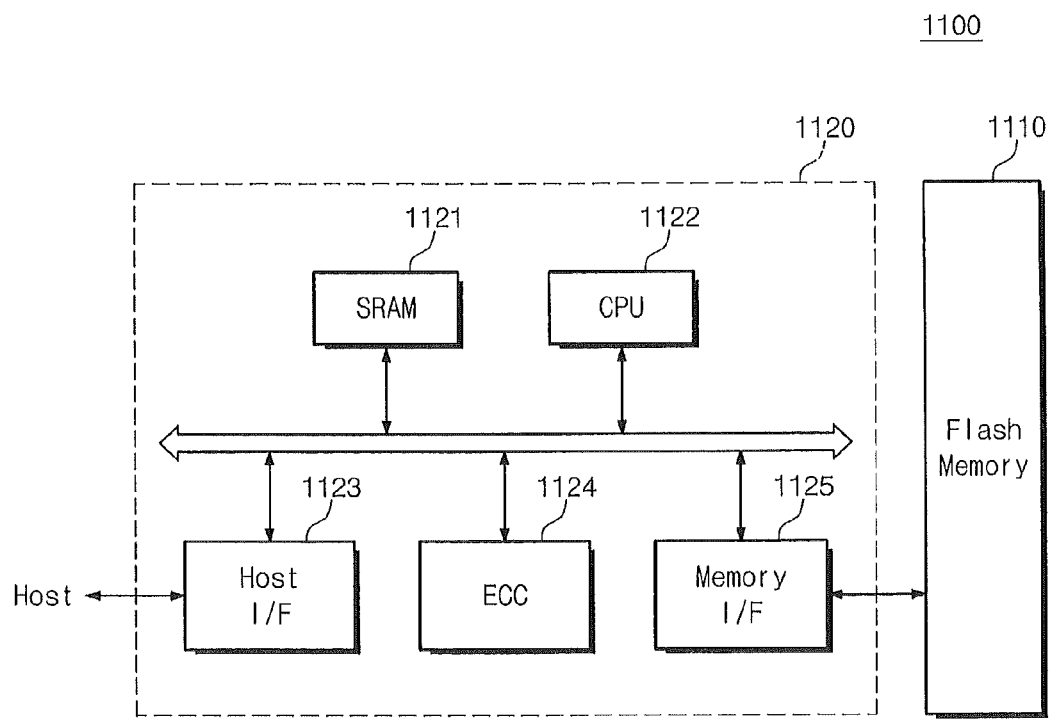
FIGS. 8 and 9 are diagrams illustrating applications of semiconductor devices according to embodiments of the invention.

FIG. 8 is a block diagram illustrating an exemplary memory card 1100 including semiconductor devices according to embodiments.

The semiconductor devices may be applied to a flash memory 1110 in this application. A semiconductor device according to embodiments may be mounted in a memory card 1100 for supporting a large amount of data storage capacity. The memory card 1100 according to this application may include a memory controller controlling overall data exchanges between a host and the flash memory 1110.

The memory controller 1120 may include a processing unit 1122 controlling an operation of the memory card 1100, an SRAM 1121, an error correction block 1124, a host interface 1123, and a memory interface 1125. The SRAM 1121 may be used as an operation memory of the processing unit 1122. The host interface 1123 may include a data exchange protocol of the host connected to the memory card 1100. The error correction block 1124 may detect or correct an error included in data read out from the flash memory 1110. The memory interface 1125 may interface with the flash memory 1110. The processing unit 1122 may perform overall control operations for data exchanges of the memory controller 1120. The memory card 1100 according to this application can provide a system having high reliability due to improved reliability of the flash memory 1110 according to an embodiment.

Hereinafter, another application of a nonvolatile memory device according to the embodiments will be described.

Figure 9:
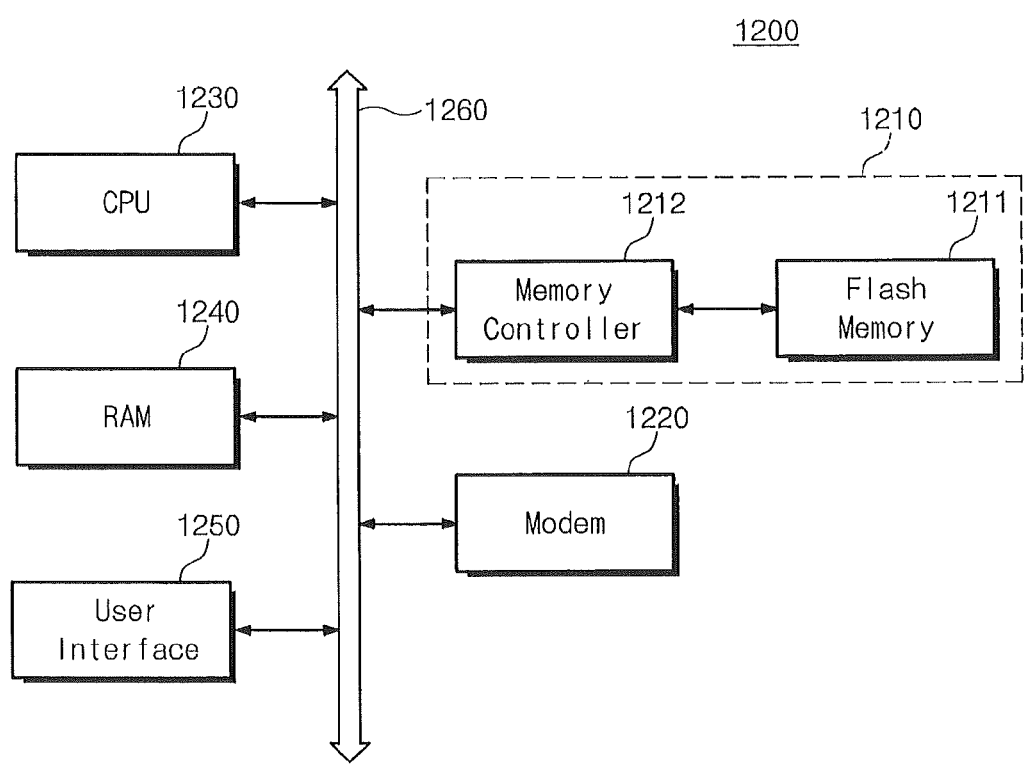

FIG. 9 is a block diagram illustrating a data processing system 1200 including a memory system 1210 having semiconductor devices according to embodiments.

Semiconductor devices according to embodiments may include a memory system 1210 in this application. The memory system 120 may be mounted in data processing systems such as mobile devices and desktop computers. The data processing system 1200 may include a memory system 1210, a modem 1220 electrically connected to a system bus, a CPU 1230, a RAM 1240, and a user interface 1250. The memory system 1210 may store data processed by the CPU 1230 or external data. In this application, the memory system 1210 according to embodiments may be implemented in a semiconductor disk device. In this case, the data processing system 1200 may store a large capacity data in the memory system 1210 stably. Also, with the improved reliability of the semiconductor device, the memory system can reduce resources necessary for error correction, and provide a high rate data exchange function to the data processing system 1200.

The semiconductor devices according to the embodiments may be mounted in various forms of packages. For example, the memory systems or storage devices may be mounted in packages such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

The thickness of a portion of a blocking layer covering an upper region of both sidewalls of a charge storage pattern is greater than the other portion of the blocking layer. Accordingly, an electric field applied to a gate electrode can be less concentrated on an edge of the charge storage pattern, thereby providing a semiconductor device having high reliability.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device comprising:
    a device isolation layer defining an active region in a substrate;
    a tunnel insulating layer on the active region;
    a charge storage pattern on the tunnel insulating layer, wherein the charge storage pattern comprises an upper surface, a sidewall, and an edge portion between the upper surface and the sidewall;
    a blocking layer on the charge storage pattern, wherein the blocking layer comprises a gate dielectric layer covering the upper surface, the sidewall, and the edge portion of the charge storage pattern and a spacer covering the edge portion of the charge storage pattern and exposing a portion of the gate dielectric layer covering the upper surface of the charge storage pattern; and
    a gate electrode on the blocking layer,
    wherein a thickness of a first portion of the blocking layer covering the edge portion of the charge storage pattern is greater than a thickness of a second portion of the blocking layer covering the sidewall of the charge storage pattern, and the spacer is between the gate dielectric layer and the gate electrode.

2. The semiconductor device of claim 1, wherein:
    the gate electrode comprises a lower electrode and an upper electrode; and
    the spacer directly contacts an upper surface of the lower electrode.

3. The semiconductor device of claim 2, wherein the lower electrode directly contacts a portion of the gate dielectric layer covering the sidewall of the charge storage pattern.

4. The semiconductor device of claim 2, wherein the lower gate electrode and the upper gate electrode define a discontinuous interface therebetween.

5. The semiconductor device of claim 1, wherein a bottom surface of the charge storage pattern directly contacts the tunnel insulating layer and the charge storage pattern has a tapered profile from the bottom surface to the upper surface of the charge storage pattern.

6. The semiconductor device of claim 1, wherein:
    the gate dielectric layer comprises a first material; and
    the spacer comprises a second material different from the first material and covers the gate dielectric layer.

7. The semiconductor device of claim 1, wherein the charge storage pattern has a slanted straight sidewall.

8. The semiconductor device of claim 1, wherein:
    the blocking layer further comprises an insulating pattern between the charge storage pattern and the gate dielectric layer; and
    the insulating pattern covers the edge portion of the charge storage pattern.

9. The semiconductor device of claim 8, wherein:
    the insulating pattern is spaced apart from the device isolation layer; and
    the gate dielectric layer directly contacts the sidewall of the charge storage pattern.

10. The semiconductor device of claim 9, wherein the gate dielectric layer directly contacts an upper surface of the device isolation layer.

11. The semiconductor device of claim 8, wherein the insulating pattern and the gate dielectric layer are provided through different processes.

12. The semiconductor device of claim 8, wherein the insulating pattern and the gate dielectric layer are provided with a discontinuous surface therebetween and are divided by the discontinuous surface.

13. The semiconductor device of claim 8, wherein:
    the edge portion of the charge storage pattern has a curved surface;
    the insulating pattern is extended from the edge portion to the upper surface of the charge storage pattern; and
    a thickness of a third portion of the blocking layer covering the upper surface of the charge storage pattern is greater than the thickness of the second portion of the blocking layer covering the sidewall of the charge storage pattern.

14. The semiconductor device of claim 13, wherein the gate dielectric layer covers the insulating pattern.

15. The semiconductor device of claim 8, wherein the insulating pattern comprises a first material and the gate dielectric layer comprises a second material different from the first material.

16. The semiconductor device of claim 15, wherein the first material is silicon oxide and the second material is silicon nitride, silicon oxynitride or a high dielectric material.

17. The semiconductor device of claim 15, wherein:
    an upper surface of the insulating pattern is higher than the upper surface of the charge storage pattern; and
    a bottom surface of the insulating pattern is between a bottom surface of the charge storage pattern and the upper surface of the charge storage pattern.

18. The semiconductor device of claim 15, wherein a portion of the gate dielectric layer directly contacting the insulating pattern comprises the second material.

19. The semiconductor device of claim 8, wherein the insulating pattern directly contacts the charge storage pattern.

20. The semiconductor device of claim 8, wherein the insulating pattern covers an entirety of the upper surface of the charge storage pattern.

* * * * *